(12) United States Patent
Kim (10) Patent No.: US 7,154,315 B2
(45) Date of Patent: Dec. 26, 2006

(54) TRANSMISSION LINE DRIVER FOR CONTROLLING SLEW RATE AND METHODS THEREOF

(75) Inventor: Chi-Won Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/095,497

(22) Filed: Apr. 1, 2005

(65) Prior Publication Data

US 2005/0231252 A1 Oct. 20, 2005

(30) Foreign Application Priority Data

Apr. 14, 2004 (KR) ...................... 10-2004-0025648

(51) Int. Cl.
*H03K 5/12* (2006.01)

(52) U.S. Cl. .................................... 327/170

(58) Field of Classification Search ................ 327/108, 327/170, 171, 306; 326/30, 27
See application file for complete search history.

(56) References Cited

U.S. PATENT DOCUMENTS

| | | | |
|---|---|---|---|
| 5,497,113 A | 3/1996 | Uber | |
| 5,539,341 A | 7/1996 | Kuo | |
| 5,887,150 A * | 3/1999 | Schneider et al. | .......... 710/100 |
| 5,917,758 A | 6/1999 | Keeth | |
| 5,939,753 A * | 8/1999 | Ma et al. | ..................... 257/339 |
| 6,320,407 B1 | 11/2001 | Sakamoto | |
| 6,380,777 B1 * | 4/2002 | Degardin et al. | ........... 327/170 |
| 6,483,354 B1 * | 11/2002 | Gasparik | ..................... 327/112 |
| 6,710,617 B1 * | 3/2004 | Humphrey | ..................... 326/30 |
| 2003/0025541 A1 | 2/2003 | Humphrey et al. | |

OTHER PUBLICATIONS

Korean Office Action Issued Nov. 28, 2005.

* cited by examiner

*Primary Examiner*—Dinh T. Le
(74) *Attorney, Agent, or Firm*—Harness, Dickey & Pierce, P.L.C.

(57) ABSTRACT

In the method of controlling a slew rate, a transmission line driver may set a logic level of at least one control signal. The setting of the logic level of the at least one control signal determines a resistance on at least one path within the transmission line driver. The resistance may be adjusted so as to vary a slope of at least one driving voltage and achieve a desired slew rate.

41 Claims, 11 Drawing Sheets

TRANSMISSION LINE DRIVER FOR CONTROLLING SLEW RATE AND METHODS THEREOF

PRIORITY STATEMENT

This application claims priority under 35 U.S.C. § 119 of Korean Patent Application No. 2004-25648, filed on Apr. 14, 2004, the contents of which are herein incorporated by reference in their entirety.

BACKGROUND OF THE INVENTION

1. Field of the Invention

The present invention relates generally to a transmission line driver and methods thereof, and more particularly to a transmission line driver for controlling slew rate and methods thereof.

2. Description of the Related Art

In a system requiring a higher-speed signal transmission, a transition time of an output signal may be a factor in determining the characteristics of a semiconductor integrated circuit. When the transition time of an output signal is less than a first threshold, Electromagnetic Interference (EMI) and/or switching noise may increase. Alternatively, when the transition time of an output signal is higher than a second threshold (e.g., where the second threshold is longer than the first threshold), jitter may be generated. Accordingly, the transition time of an output signal may be set in order to avoid the above-described timing problems.

Figure 1:
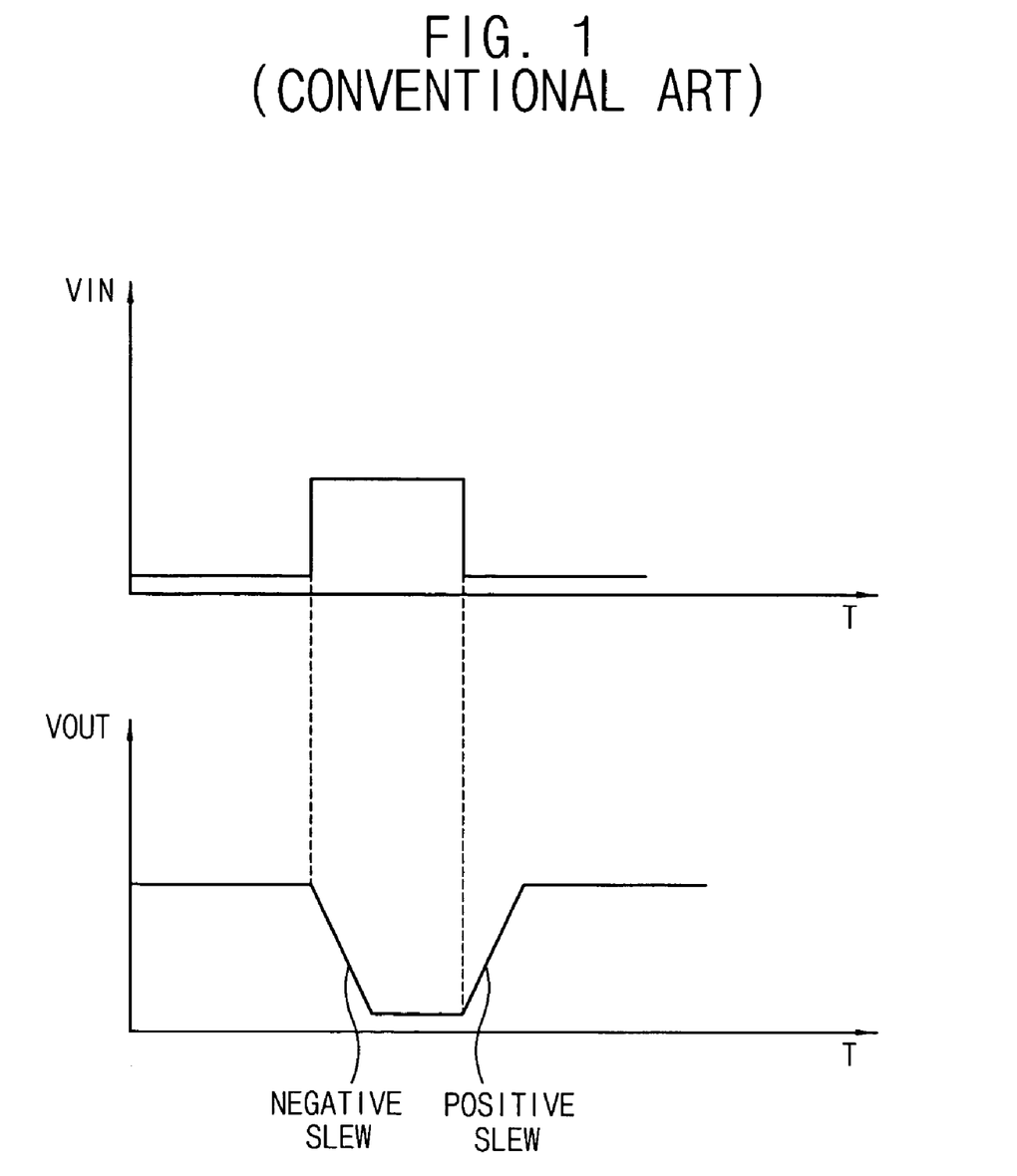
FIG. 1 is a timing diagram illustrating the concept of a slew rate.

FIG. 1 is a timing diagram illustrating the concept of a slew rate. As shown in FIG. 1, the slew rate may refer to a voltage rate of change of an output signal during a transition from a first logic level (e.g., a higher voltage level) to a second logic level (e.g., a lower voltage level) or from the second logic level to the first logic level in response to an input signal VIN. The input signal VIN may be a square wave.

Figure 2:
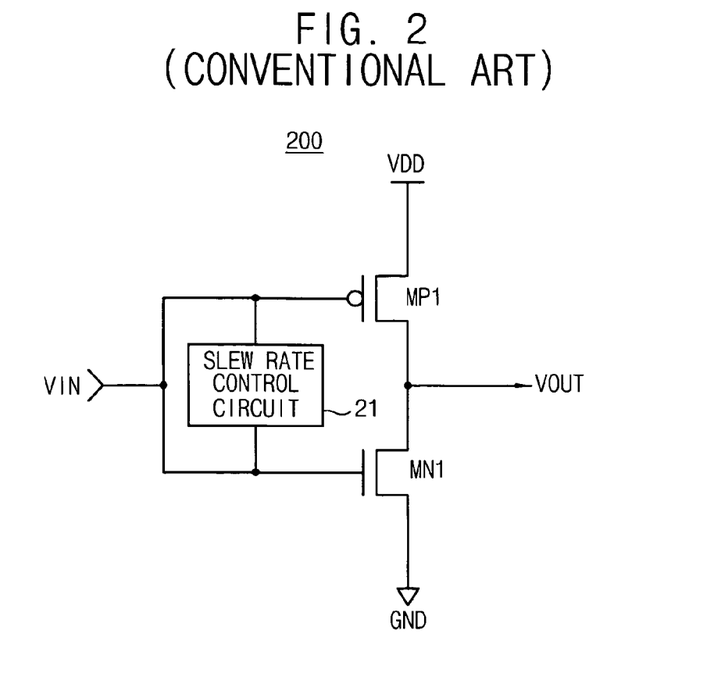
FIG. 2 is a schematic diagram illustrating a conventional push-pull type transmission line driver 200.

FIG. 2 is a schematic diagram illustrating a conventional push-pull type transmission line driver 200. Referring to FIG. 2, the push-pull type transmission line driver 200 may include a slew-rate control circuit 21 to control the voltage applied to the gates of the pull-up transistor MP1 and/or a pull-down transistor MN1 such that the transmission line driver 200 may control a charging time and/or a discharging time of the output signal of the push-pull transmission line driver 200. However, the push-pull type transmission line driver 200 may not be suitable for use in a system operating at higher speeds because the output voltage VOUT may oscillate between a supply voltage VDD and a ground voltage GND.

Figure 3:
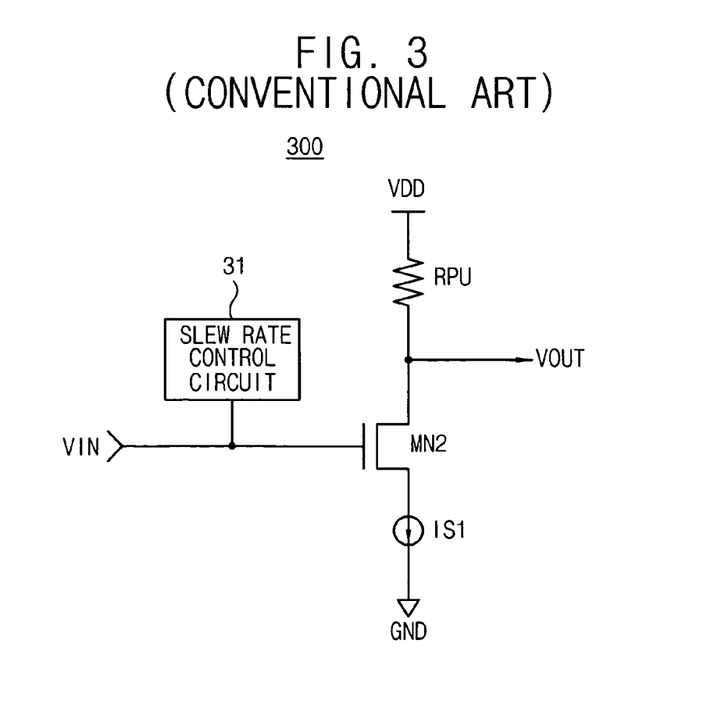
FIG. 3 is a schematic diagram illustrating a conventional transmission line driver including a pull-up resistor.

FIG. 3 is a schematic diagram illustrating a conventional transmission line driver 300 including a pull-up resistor RPU. Referring to FIG. 3, the transmission line driver 300 may control the slew rate by adjusting a voltage received at the gate of a driving transistor MN2. The transmission line driver 300 may adjust the voltage applied to the gate of the driving transistor MN2 with a slew-rate control circuit 31.

An output voltage VOUT of the transmission line driver 300 may not make a full transition (e.g., between the first voltage level and the second voltage level and/or the second voltage level and the first voltage level) because the pull-up resistor RPU and the current source IS1 may be coupled between the supply voltage VDD and the ground voltage GND. Thus, when a voltage applied to the gate of the driving transistor MN2 is changed to adjust the slew rate, a swing width (e.g., the time required to make a complete voltage level transition) of the output voltage VOUT and/or the slew rate may be changed. Further, the slew-rate control circuit 31 may be a complicated circuit (e.g., difficult and/or expensive to fabricate).

SUMMARY OF THE INVENTION

An example embodiment of the present invention is directed to a transmission line driver, including a first resistance element coupled between a first supply voltage and a first output node, a first pull-down device coupled in parallel between the first output node and a first plurality of driving voltages and a first pull-down driving circuit configured to receive a first input signal to generate the first plurality of driving signals, a slope of at least one of the first plurality of driving signals being based on at least one slew-rate control signal.

Another example embodiment of the present invention is directed to a method of controlling a slew rate, including maintaining an output node at a first logic level, generating a plurality of driving signals, each of the plurality of driving signals including a different slope based on at least one slew rate control signal and transitioning the output node from the first logic level to a second logic level in response to the plurality of driving signals.

Another example embodiment of the present invention is directed to a method of controlling a slew rate, including adjusting a resistance in order to generate a plurality of driving voltages including at least two different slopes, at least one of the at least two different slopes based on the adjusted resistance.

BRIEF DESCRIPTION OF THE DRAWINGS

The present invention will become more apparent by describing in detail example embodiments thereof with reference to the attached drawings in which.

DESCRIPTION OF THE EXAMPLE
EMBODIMENTS OF THE PRESENT
INVENTION

Hereinafter, example embodiments of the present invention will be described in detail with reference to the accompanying drawings.

In the Figures, the same reference numerals are used to denote the same elements throughout the drawings.

Figure 4:
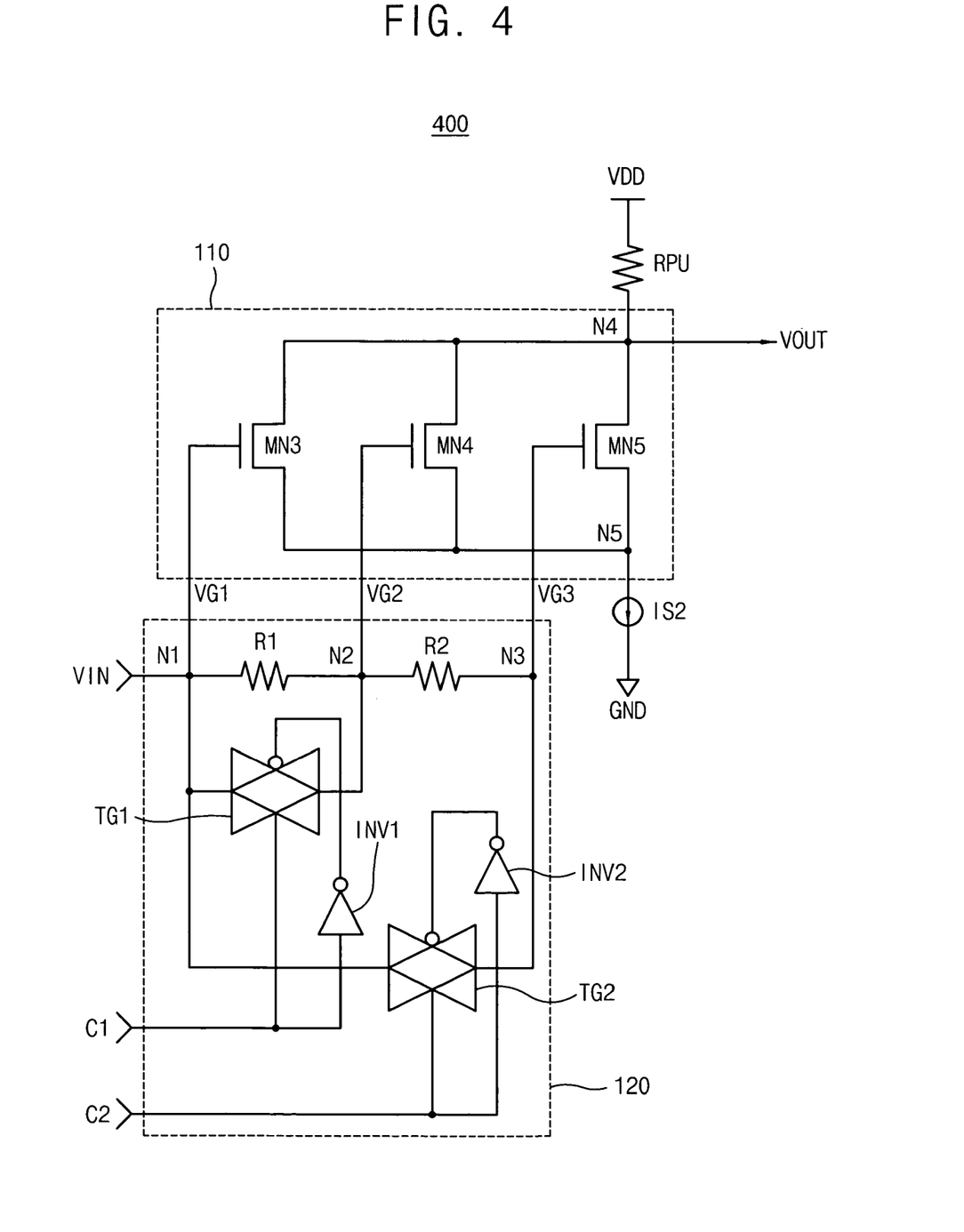
FIG. 4 is a circuit diagram illustrating a transmission line driver according to an example embodiment of the present invention.

FIG. 4 is a circuit diagram illustrating a transmission line driver 400 according to an example embodiment of the present invention. The transmission line driver 400 may include a pull-up resistor RPU, a pull-down device 110, a pull-down driving circuit 120, and/or a current source IS2.

In another example embodiment of the present invention, referring to FIG. 4, while the pull-down device 110 may include three NMOS transistors MN3, MN4, and MN5 (e.g., as shown in FIG. 4), in other example embodiments of the present invention the pull-down device 110 may include any number of NMOS transistors.

In the example embodiment of FIG. 4, the pull-up resistor RPU may connect a node N4 and a supply voltage VDD in order to pull up (e.g., transition) the node N4 to a first logic level (e.g., a higher voltage level).

In another example embodiment of the present invention, the pull-down device 110 may include NMOS transistors MN3, MN4, and MN5 coupled in parallel between the node N4 and a node N5. The NMOS transistors MN3, MN4 and/or MN5 may pull down (e.g., transition) the node N4 to a second logic level (e.g., a lower voltage level). The pull-down driving circuit 120 may receive an input signal VIN to generate driving signals VG1, VG2, and VG3. The driving signals VG1, VG2 and VG3 may include different slopes during logic transitions in response to slew-rate control signals. The driving signals VG1, VG2, and VG3 may be applied to the gates of NMOS transistors MN3, MN4, and MN5.

A resistance of the paths from the input terminal (e.g., where the input signal VIN is received) to each gate of the NMOS transistors MN3, MN4, and/or MN5 may be determined based on the slew-rate control signals C1 and/or C2. The pull-down driving circuit 120 may include resistors R1 and R2. The resistors R1 and R2 may be coupled between the gates of the NMOS transistors MN3, MN4, and/or MN5.

The pull-down driving circuit 120 may include transmission gates TG1 and TG2. The transmission gates TG1 and TG2 may be coupled between the gate of the NMOS transistor MN3 and each of the gates of the NMOS transistors MN4 and MN5. The transmission gates TG1 and TG2 may be set (e.g., turned on or off) in response to the slew-rate control signals C1 and C2, respectively.

In another example embodiment of the present invention, referring to FIG. 4, while the transmission gates TG1 and TG2 are denoted by symbols, the transmission gates TG1 and TG2 may include an NMOS transistor and a PMOS transistor, respectively. The circular portion of the transmission gates TG1 and TG2 may represent a PMOS transistor and the portion not including a circle may represent an NMOS transistor.

In another example embodiment of the present invention, inverters INV1 and INV2 may receive and invert the slew-rate control signals C1 and C2. The inverted slew-rate control signals may be applied to the gate of the PMOS transistor at each of the transmission gates TG1 and TG2.

The current source IS2 may reduce the current flowing through the NMOS transistors MN3, MN4, and/or MN5 when the input signal VIN is at the first logic level (e.g., a higher logic level). Alternatively, the node N5 may be connected to the ground GND (e.g., when the current source IS2 does not include a current).

Operation of the transmission line driver 400 of FIG. 4 according to other example embodiments of the present invention will now be described.

In another example embodiment of the operation of the transmission line driver 400 of FIG. 4, the input signal VIN may be received at a node N1 of the pull-down driving circuit 120. The input signal VIN may subsequently be received at the gate of the NMOS transistor MN3. An elongated signal (e.g., a signal including an elongated transition time based on the resistor R1 and the capacitance of the NMOS transistor MN4) may be received at the gate of the NMOS transistor MN4. The capacitance of the NMOS transistor MN4 may include a gate-source capacitance (Cgs) and/or a gate-drain capacitance (Cgd) (not shown).

The transmission gate TG1 coupled across the resistor R1 may be switched by the slew-rate control signal C1. The elongated signal may be received at the gate of the NMOS transistor MN5. The transmission gate TG2 coupled between the node N1 and the node N3 may be switched by the slew-rate control signal C2. In another example, when each of the resistors R1 and R2 include the same resistance, it may be easier to control the slew rate.

In another example embodiment of the present invention, when both the slew-rate control signals C1 and C2 are set to the first logic level, the transmission gates TG1 and TG2 may be turned on. The voltage potentials at nodes N1, N2, and/or N3 may be the same. Thus, the input signal VIN may be received at the gates of NMOS transistors MN3, MN4, and MN5. In other words, the resistors R1 and R2 may not affect the operation of the circuit (e.g., because the transmission gates TG1 and TG2 are turned on).

In another example embodiment of the operation of the transmission line driver 400 of FIG. 4, when the slew-rate control signal C1 is at the first logic level and the slew-rate control signal C2 is at a second logic level (e.g., a lower logic level), the transmission gate TG1 may be turned on and the transmission gate TG2 may be turned off. The input signal VIN may be received at the gate of the NMOS transistor MN4. An elongated signal (e.g., a signal including an elongated transition time based on the resistor R2 and the capacitance of the NMOS transistor MN5) may be received at the gate of the NMOS transistor MN5.

In another example embodiment of the present invention, when both the slew-rate control signals C1 and C2 are at the second logic level, the transmission gates TG1 and TG2 may be turned off. A first elongated signal (e.g., a signal including an elongated transition time based on the resistor R1 and the capacitance of the NMOS transistor MN4) may be received at the gate of the NMOS transistor MN4. A second elongated signal (e.g., a signal including an elongated transition time based on the resistors R1 and R2 and the capacitance of the NMOS transistor MN5) may be received at the gate of the NMOS transistor MN5.

Figure 5:
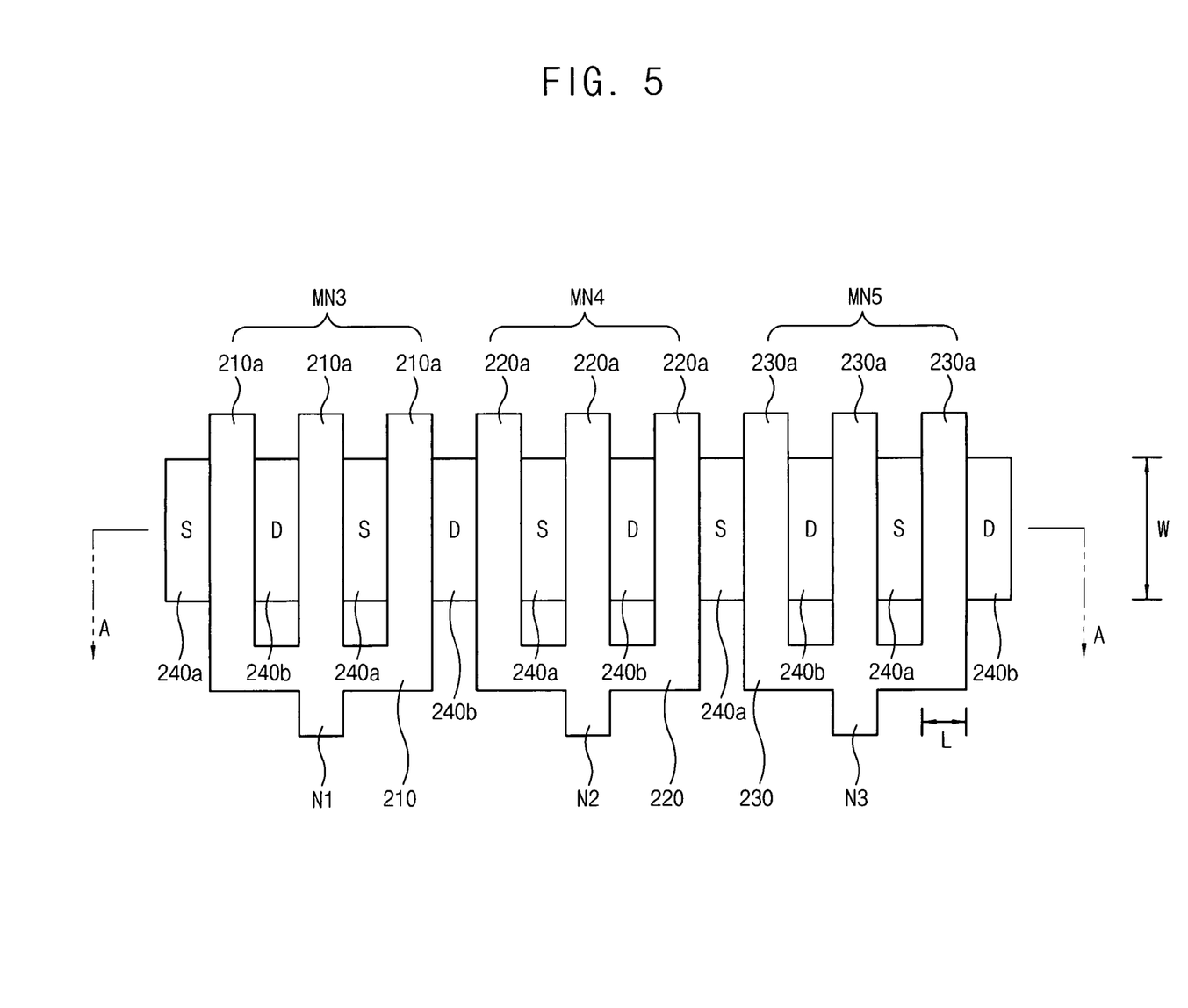
FIG. 5 is a plan view illustrating a layout of the pull-down device of FIG. 4 according to another example embodiment of the present invention.

FIG. 5 is a plan view illustrating a layout of the pull-down device 110 of FIG. 4 according to another example embodiment of the present invention. As shown in FIG. 5, gates 210a, 220a and 230a of the NMOS transistors MN3, MN4 and MN5, respectively, may be of a multi-finger type and may define a source area 240a and/or a drain area 240b.

In the example embodiment of FIG. 5, when the source area 240a and the drain area 240b are relatively small and the gates 210a, 220a and 230a are multi-finger type gates, a driving capacity of current may be increased. Further, a plurality of MOS transistors (e.g., NMOS transistors MN3, MN4, and MN5) may be connected in parallel in a reduced area.

Figure 6:
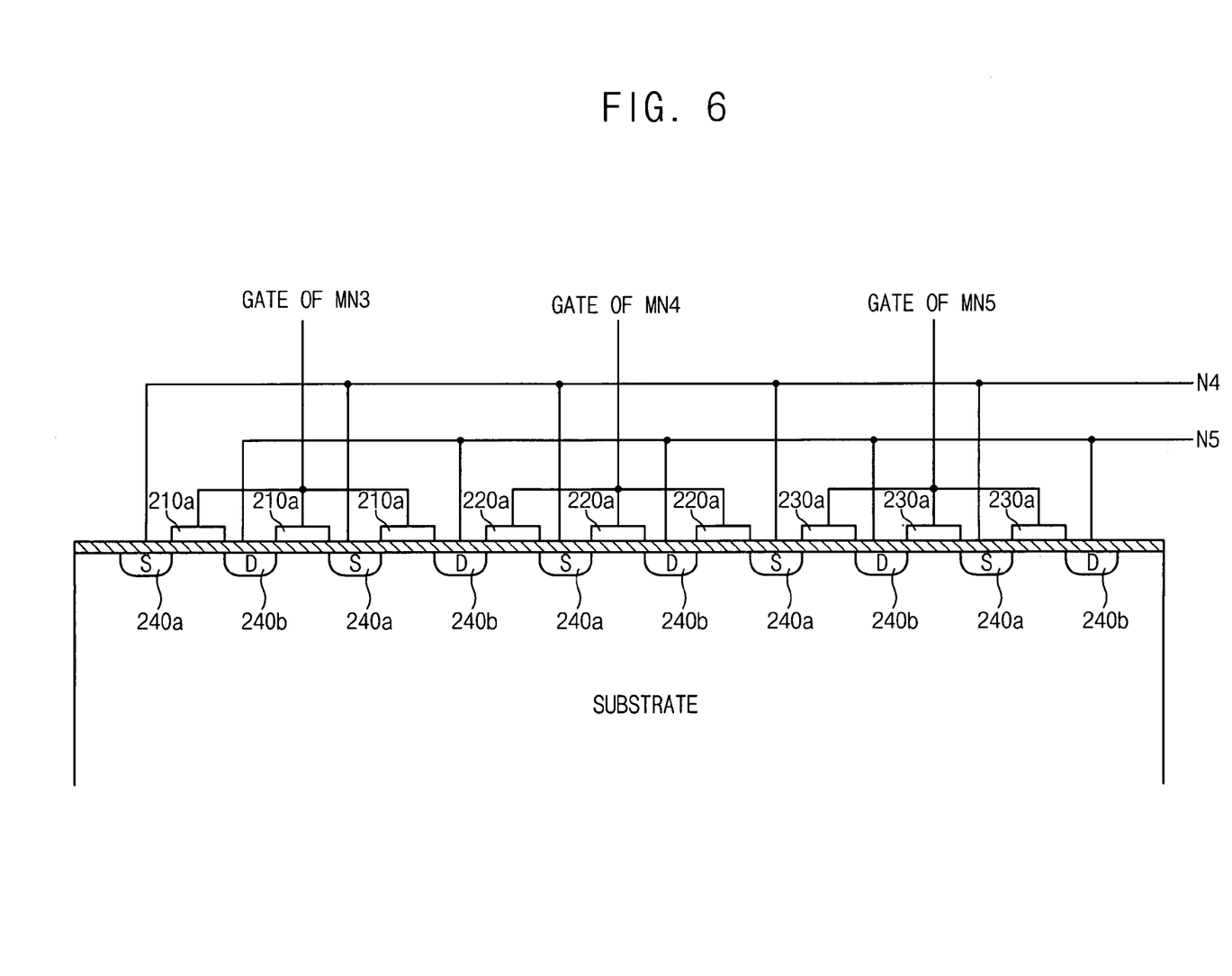
FIG. 6 is a cross-sectional view along a line I–I' of FIG. 5.

FIG. 6 is a cross-sectional view along a line I–I' of FIG. 5. As shown in FIG. 6, the source areas 240a may be coupled to the node N4, and the drain areas 250a may be coupled to the node N5. Further, as shown in FIG. 6, the source areas 240a and the drain areas 240b may be arranged so as to alternate.

Figure 7:
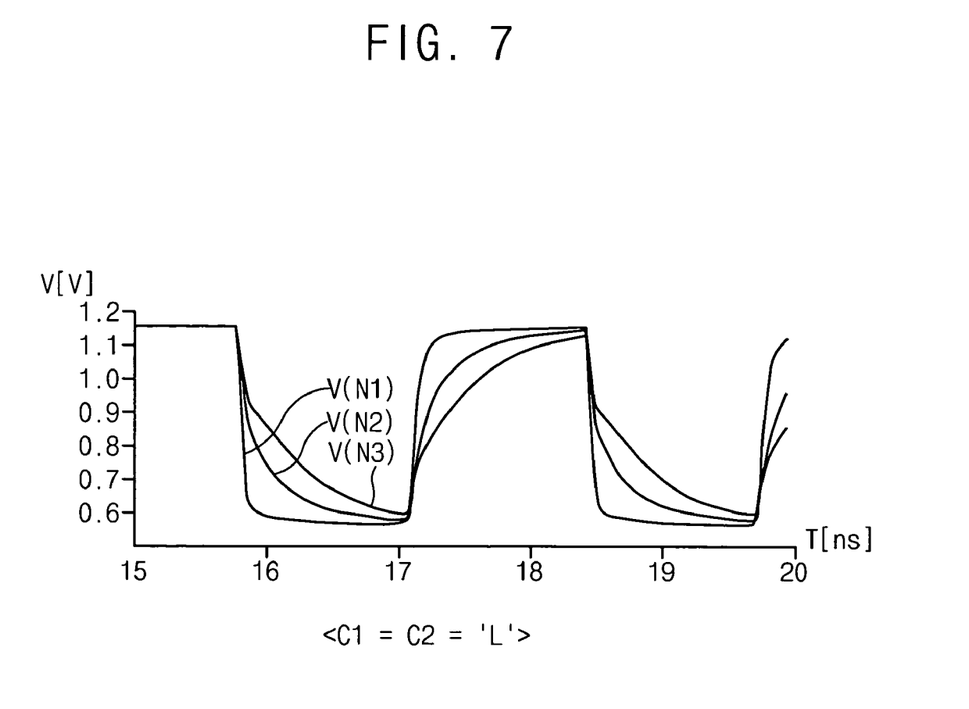
FIG. 7 and FIG. 8 are graphs illustrating waveforms of signals applied to the gate of each transistor in FIG. 4 according to another example embodiment of the present invention.
Figure 8:
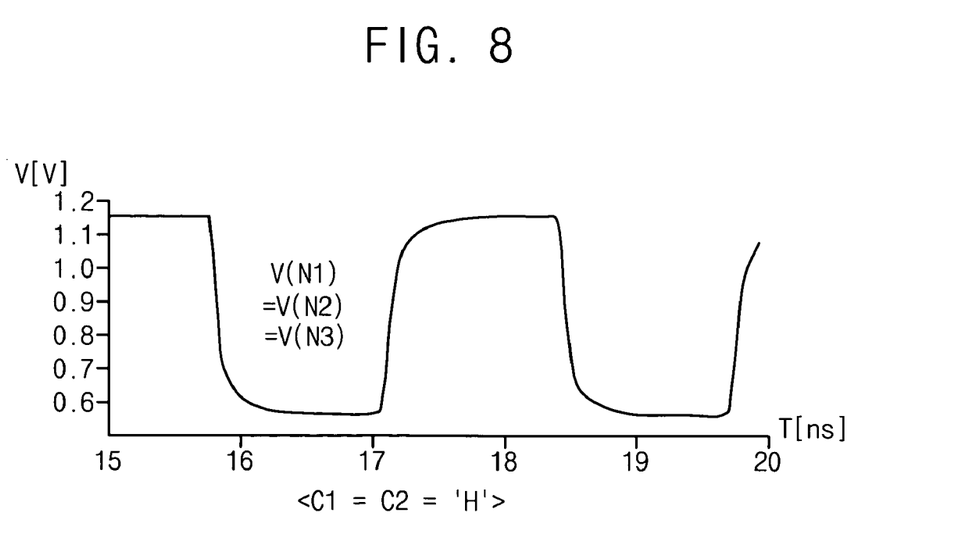

FIG. 7 and FIG. 8 are graphs illustrating waveforms of signals applied to the gate of each transistor (e.g., MN3, MN4 and MN5) in FIG. 4 according to another example embodiment of the present invention. More particularly, FIG. 7 illustrates the waveforms of signals applied to the gate of each transistor when both the slew rate control signals C1 and C2 are at the second logic level and FIG. 8 illustrates the waveforms of signals applied to the gate of each transistor when both the slew-rate control signals C1 and C2 are at the first logic level.

In the example embodiment of FIG. 7, when both the control signals C1 and C2 are at the second logic level, the transmission gates TG1 and TG2 may be turned off, and the resistors R1 and R2 may affect the operation of the circuit (e.g., because the resistors R1 and R2 may not be shorted out by a transistor). The input signal VIN may be received at the gate of the NMOS transistor MN3 (e.g., V(N1)). A first elongated signal (e.g., V(N2)) (e.g., a signal including an elongated transition time based on the resistor R1 and the capacitance of the NMOS transistor MN4) may be received at the gate of the NMOS transistor MN4. A second elongated signal (e.g., V(N3)) (e.g., a signal including an elongated transition time based on the resistor R2 and the capacitance of the NMOS transistor MN5) may be received at the gate of the NMOS transistor MN5. Referring to FIG. 7, the voltage V(N1) of the node N1 may be the same as the input signal VIN. The voltage V(N2) of the node N2 may include a longer transition time as compared to the input signal VIN (e.g., based on the resistor R1 and the capacitance of the NMOS transistor MN4). Further, the voltage V(N3) (e.g., based on the resistors R1, R2 and the capacitance of the NMOS transistors MN4 and MN5) of the node N3 may include a waveform having a longer transition time as compared to the input signal VIN. The voltage V(N3) of the node N3 may also include a longer transition time as compared to the voltage V(N2) of the node N2.

In the example embodiment of FIG. 8, when both of the slew-rate control signals C1 and C2 are at the first logic level, the transmission gates TG1 and TG2 may be turned on, and the resistors R1 and R2 may not affect the operation of the circuit. The input signal VIN may be received at the gate of the NMOS transistors MN3, MN4 and MN5. As shown in FIG. 8, the transition times (e.g., swing widths) of voltages at the nodes N1, N2 and N3 may be the same.

Figure 9:
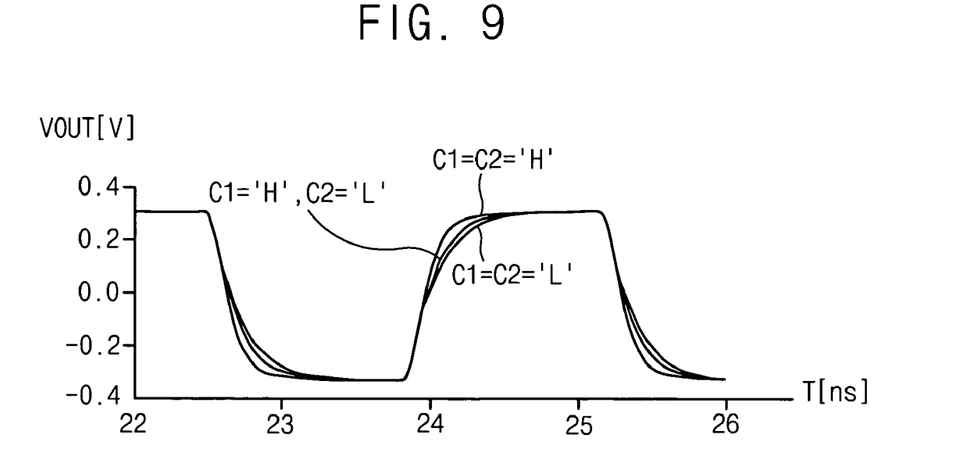
FIG. 9 is a graph illustrating the waveforms of output voltages of the transmission line driver of FIG. 4 according to another example embodiment of the present invention.

FIG. 9 is a graph illustrating the waveforms of output voltages of the transmission line driver 400 of FIG. 4 according to another example embodiment of the present invention.

In another example embodiment of the present invention, as discussed above with respect to FIG. 4, when both the slew-rate control signals C1 and C2 are at the first logic level, the input signal VIN may be received at the gate of the NMOS transistors MN3, MN4 and MN5. Thus, as shown in FIG. 9, the waveform of the output voltage VOUT may include a shorter transition time when the slew-rate control signals C1 and C2 are at the first logic level.

In another example embodiment of the present invention, as discussed above with respect to FIG. 4, when the slew-rate control signal C1 is at the first logic level and the slew-rate control signal C2 is at the second logic level, the input signal VIN may be received at the gate of the NMOS transistor MN4. An elongated signal (e.g., a signal including an elongated transition time based on the resistor R2 and the capacitance of the NMOS transistor MN5) may be received at the gate of the NMOS transistor MN5. Thus, as shown in FIG. 9, the waveform of the output voltage VOUT may include a longer transition time when the control signal C1 is at the first logic level and the control signal C2 is at the second logic level (e.g., as compared to the above-described condition where the control signals C1 and C2 are both at the first logic level).

In another example embodiment of the present invention, when both the slew-rate control signals C1 and C2 are at the second logic level, the input signal VIN may be received at the gate of the NMOS transistor MN3. A first elongated signal (e.g., a signal including an elongated transition time based on the resistor R1 and the capacitance of the NMOS transistor MN4) may be received at the gate of the NMOS transistor MN4. A second elongated signal (e.g., a signal including an elongated transition time based on the resistors R1 and R2 and the capacitance of the NMOS transistor MN5) may be received at the gate of the NMOS transistor MN5. Thus, as shown in FIG. 9, the waveform of the output voltage VOUT may include a longer transition time (e.g., when both the control signals C1 and C2 are at the second logic level as compared to other above-described settings of the control signals C1 and C2).

Figure 10:
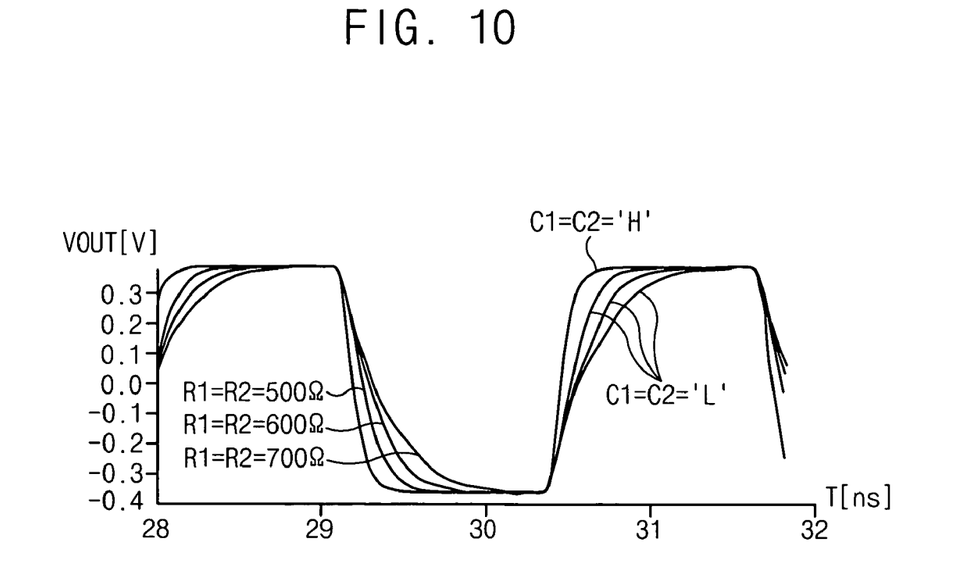
FIG. 10 is a graph illustrating waveforms of other output voltages of the transmission line driver of FIG. 4 according to another example embodiment of the present invention.

FIG. 10 is a graph illustrating waveforms of other output voltages of the transmission line driver 400 of FIG. 4 according to another example embodiment of the present invention. More particularly, FIG. 10 illustrates simulation results at different resistance levels of the resistors R1 and R2 in the transmission line driver 400 of FIG. 4.

In another example embodiment of the present invention, referring to FIG. 10, when the control signals C1 and C2 are at the second logic level, the resistors R1 and R2 may affect the operation of the circuit (e.g., because the resistors R1 and R2 may not be shorted out when the control signals C1 and C2 are at the second logic level). The signals (e.g., elongated signals) received at the gates of the NMOS transistors MN3, MN4 and MN5 may include the same transition time (e.g., at given resistances for resistors R1 and R2, e.g., where R1=R2=500 Ω, R1=R2=600 Ω, R1=R2=700 Ω, etc.).

The above-described example waveforms of the input voltages and the output voltages in FIGS. 7–10 may assume a resistance of 50 Ω for the pull-up resistor RPU.

In another example embodiment of the present invention, as shown in the above-described example waveforms of FIGS. 7–10, the transmission line driver 400 of FIG. 4 may control the slew rate of a circuit by adjusting the logic levels of the slew-rate control signals C1 and C2 and/or by changing the resistances of the resistors R1 and R2 coupled between the gates of the transistors MN3, MN4 and MN5 (e.g., which may be connected in parallel).

Figure 11:
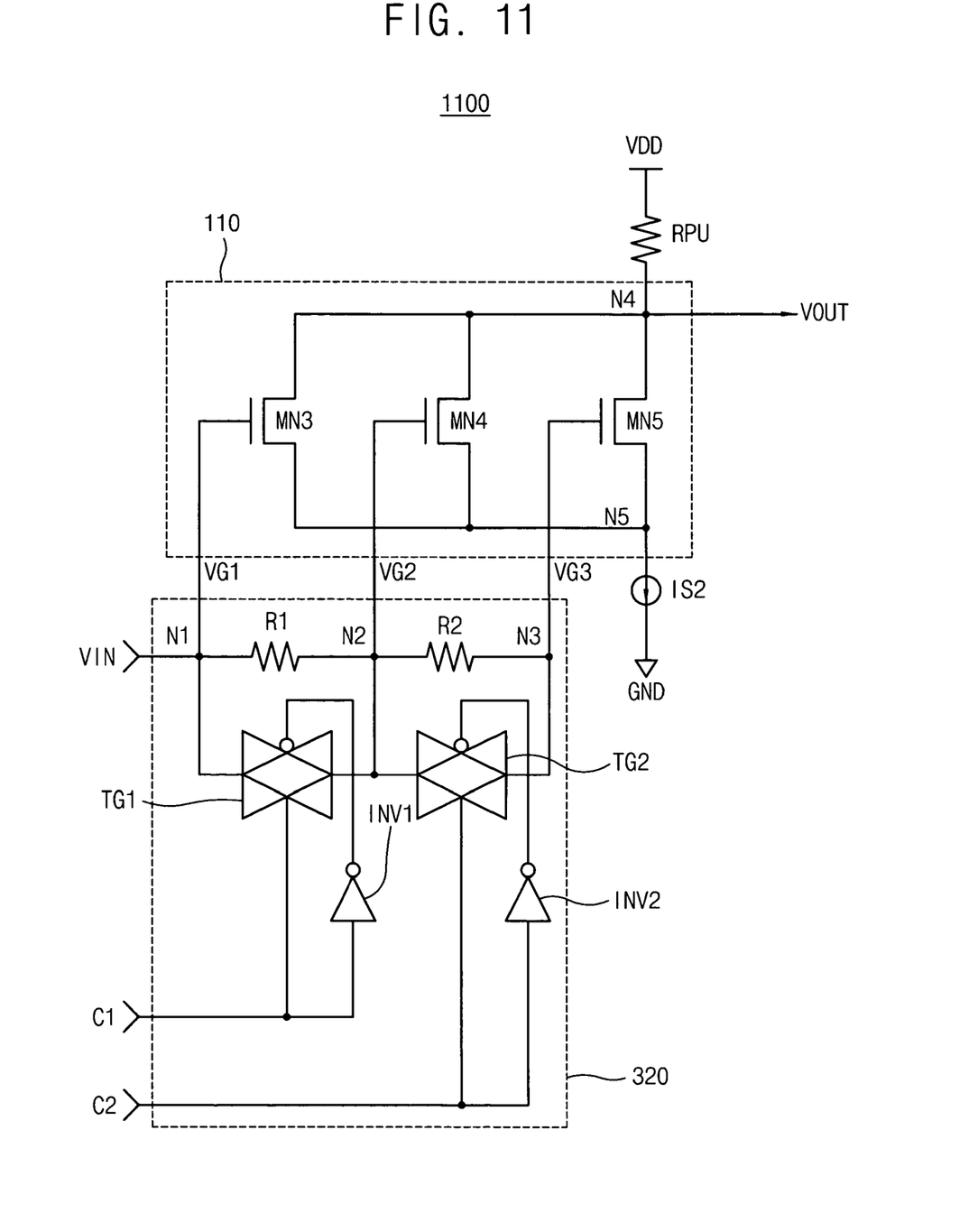
FIG. 11 is a circuit diagram illustrating another transmission line driver according to another example embodiment of the present invention.

FIG. 11 is a circuit diagram illustrating another transmission line driver 1100 according to another example embodiment of the present invention. In the example embodiment of the FIG. 11, the transmission line driver 1100 of FIG. 11 may function similar to the above-described transmission line driver 400 FIG. 4 with the exception of including a different connection structure at the transmission gates TG1 and TG2.

Referring to FIG. 11, a pull-down driving circuit 320 may receive the input signal VIN and the slew-rate control signals C1 and C2. The pull-down may include an impedance that may be changed in response to the slew-rate control signals C1 and C2. The pull-down driving circuit 320 may generate gate voltages applied to the gates of the NMOS transistors MN3, MN4 and MN5. The pull-down driving circuit 320 may include resistors R1 and R2 coupled between the gates of the NMOS transistors MN3, MN4 and MN5. Further, the pull-down driving circuit 320 may include the transmission gate TG1 coupled between the gate of the NMOS transistor MN3 and the NMOS transistor MN4. The transmission gate TG1 may be set (e.g., turned on or off) in response to the slew-rate control signal C1. The transmission gate TG2 coupled between the gate (at node N2) of the NMOS transistor MN4 and the gate of the NMOS transistor MN5 and may be set (e.g., turned on or off) in response to the slew-rate control signal C2.

Operation of the transmission line driver 1100 according to another example embodiment of the present invention will now be described.

In another example embodiment of the operation of the transmission line driver 1100 of FIG. 11, the input signal VIN may be received at the node N1 of the pull-down driving circuit 320. The input signal VIN may be received at the gate of the NMOS transistor MN3. A first elongated signal (e.g., a signal including an elongated transition time based on the resistor R1 and the capacitance of the NMOS transistor MN4) may be received at the gate of the NMOS transistor MN4. The capacitance of the NMOS transistor MN4 may include a gate-source capacitance (Cgs) and/or a gate-drain capacitance (Cgd) (not shown). The transmission gate TG1 coupled across the resistor R1 may be switched by the slew-rate control signal C1. A second elongated signal (e.g., a signal including an elongated transition time based on the resistor R2 and the capacitance of the NMOS transistor MN5) may be received at the gate of the NMOS transistor MN5. The transmission gate TG2 coupled between the node N2 and the node N3 may be switched (e.g., turned on or off) by the slew-rate control signal C2.

In another example embodiment of the operation of the transmission line driver 1100 of FIG. 11, when the resistors R1 and R2 are set to the same resistance, a control of the slew rate may be increased.

In another example embodiment of the operation of the transmission line driver 1100 of FIG. 11, when both the slew-rate control signals C1 and C2 are at the first logic level, the transmission gates TG1 and TG2 may be turned on. The voltage potentials at nodes N1, N2 and N3 may be the same. Thus, the input signal VIN may be received at the gates of NMOS transistors MN3, MN4 and MN5. In other words, the resistors R1 and R2 may not affect the operation of a circuit (e.g., because the resistors R1 and R2 may be shorted out based on the slew-rate control signals C1 and C2).

In another example embodiment of the operation of the transmission line driver 1100 of FIG. 11, when the slew-rate control signal C1 is at the first logic level and the slew-rate control signal C2 is at the second logic level, the transmission gate TG1 may be turned on and the transmission gate TG2 may be turned off. Thus, the input signal VIN may be received at the gate of the NMOS transistor MN4. An elongated signal (e.g., a signal including an elongated transition time based on the resistor R2 and the capacitance of the NMOS transistor MN5) may be received at the gate of the NMOS transistor MN5.

In another example embodiment of the operation of the transmission line driver 1100 of FIG. 11, when both the slew-rate control signals C1 and C2 are at the second logic level, the transmission gates TG1 and TG2 may be turned off. A first elongated signal (e.g., a signal including an elongated transition time based on the resistor R1 and the capacitance of the NMOS transistor MN4) may be received at the gate of the NMOS transistor MN4. A second elongated signal (e.g., a signal including an elongated transition time based on the resistors R1 and R2 and the capacitance of the NMOS transistor MN5) may be received at the gate of the NMOS transistor MN5.

Figure 12:
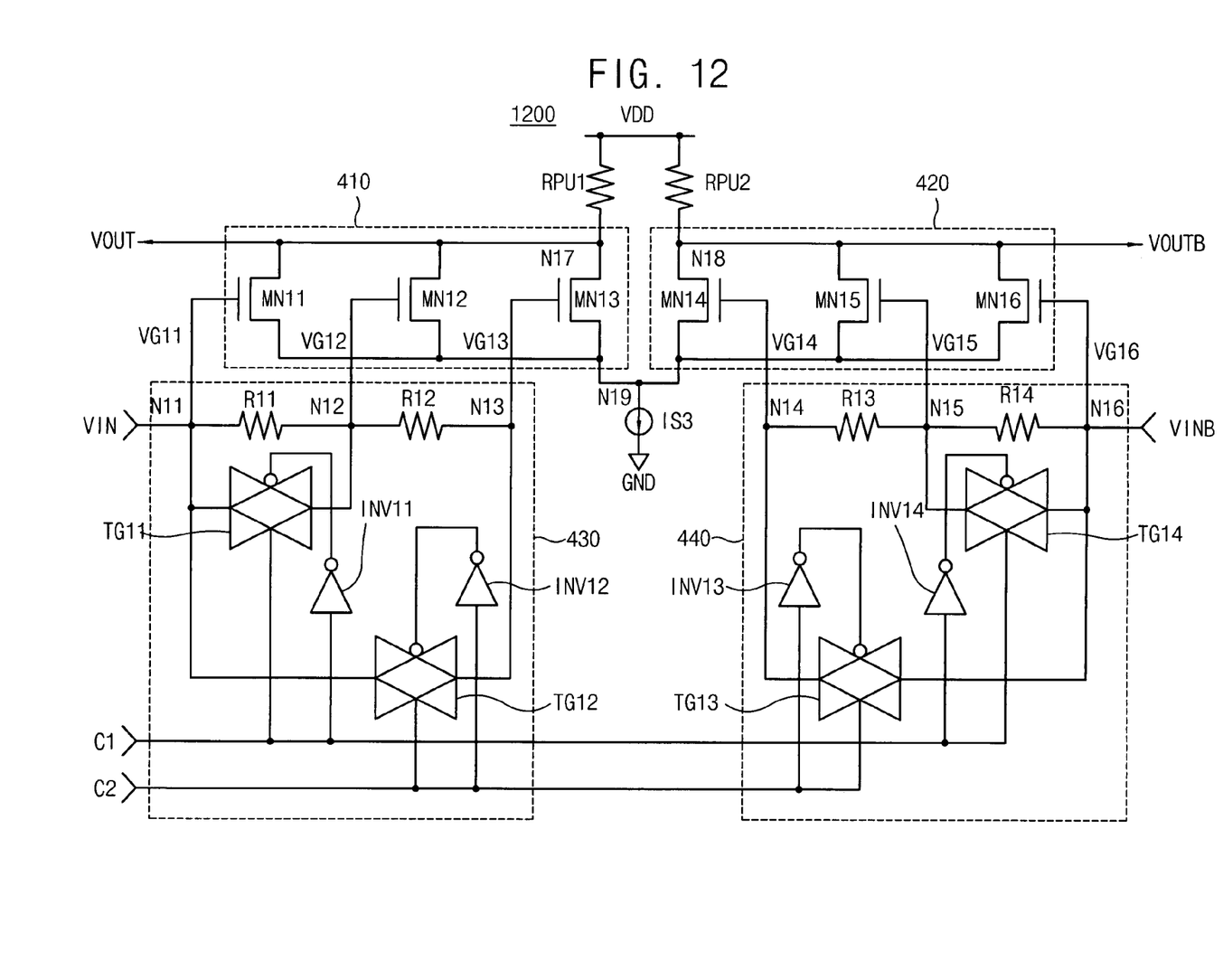
FIG. 12 is a circuit diagram illustrating a transmission line driver according to another example embodiment of the present invention.

FIG. 12 is a circuit diagram illustrating a transmission line driver 1200 according to another example embodiment of the present invention.

In another example embodiment of the present invention, the transmission line driver 1200 of FIG. 12 may be a differential transmission line driver, the transmission line driver 1200 of FIG. 12 may include a symmetrical structure. The symmetrical structure may include two transmission line drivers, each of the two transmission line drivers being similar to the transition line driver 400 as described above with respect to FIG. 4. The transmission line driver 1200 of FIG. 12 may receive the input signal VIN and an inverted input signal VINB (e.g., an inverse of the input signal VIN) in order to generate the output signal VOUT and an inverted output signal VOUTB (e.g., an inverse of the output signal VOUT).

In the example embodiment of FIG. 12, the transmission line driver 1200 may include a first pull-up resistor RPU1, a second pull-up resistor RPU2, a first pull-down device 410, a second pull-down device 420, a first pull-down driving circuit 430, a second pull-down driving circuit 440 and a current source IS3.

In another example embodiment of the present invention, while described with a given number of transistors, the first pull-down device 410 and the second pull-down device 420 may each include any number of MOS transistors. However, for the sake of brevity, each of the pull-down devices 410 and 420 may be described below as including the NMOS transistors MN3, MN4 and MN5 (e.g., as above described with respect to FIG. 4).

In the example embodiment of FIG. 12, the first pull-up resistor RPU1 may connect a node N17 to the supply voltage VDD to pull up the node N17 to the first logic level (e.g., a higher voltage or higher logic level), and the second pull-up resistor RPU2 may connect a node N18 to the supply voltage VDD to pull up the node N18 to the first state.

In the example embodiment of FIG. 12, the first pull-down device 410 may include the NMOS transistors MN11, MN12 and MN13 coupled in parallel between the node N17 and a node N19. The second pull-down device 420 may include NMOS transistors MN14, MN15 and MN16 coupled in parallel between the node N18 and the node N19. The node 19 may be pulled down to the second logic level (e.g., a lower voltage or lower logic level) by first pull-down device 410 and/or the second pull-down device 420.

The first pull-down driving circuit 430 may receive the input signal VIN in order to generate driving signals VG11, VG12 and VG13. The driving signals VG11, VG12 and VG13 may each include a different slope (e.g., based on the slew-rate control signals C1 and C2). The driving signals VG11, VG12 and VG13 may be received at the gates of NMOS transistors MN11, MN12 and MN13, respectively. A resistance of the path from the input terminal (e.g., where one of the driving signals VG11, VG12 and VG13 may be received) to a gate of the NMOS transistors MN11, MN12 and/or MN13 may vary based on the slew-rate control signals C1 and C2.

The first pull-down driving circuit 430 may include resistors R11 and R12 coupled between the gates of the NMOS transistors MN11, MN12 and MN13. The first pull-down driving circuit 430 may also include transmission gates TG11 and TG12 coupled between the gate of the NMOS transistor MN11 and each of the gates of NMOS transistors MN12 and MN13. The transmission gates TG11 and TG12 may be set (e.g., turned on or off) in response to the slew-rate control signals C1 and C2.

In another example embodiment of the present invention, while the transmission gates TG11 and TG12 in FIG. 12 are denoted by symbols for simplicity, the transmission gates TG11 and TG12 may each include an NMOS transistor and a PMOS transistor. The circular portion of the transmission gates TG11 and TG12 may represent a PMOS transistor and the portion without a circle may represent an NMOS transistor.

In the example embodiment of FIG. 12, inverters INV11 and INV12 may receive and invert the slew-rate control signals C1 and C2, respectively. The inverted slew-rate control signals may be received at the gate of a PMOS transistor at each of the transmission gates TG11 and TG12. The second pull-down driving circuit 440 may receive the inverted input signal VINB to generate driving signals VG14, VG15 and VG16. The driving signals V14, VG15 and VG16 may each include a different slope (e.g., based on the slew-rate control signals C1 and C2). The driving signals VG14, VG15 and VG16 may be received at the gates of NMOS transistors MN14, MN15 and MN16, respectively. A resistance of the path from the input terminal (e.g., where one of the driving signals VG14, VG15 and VG16 may be received) to each gate of the NMOS transistors MN14, MN15 and MN16 may be varied (e.g., adjusted) based on the slew-rate control signals C1 and C2.

The second pull-down driving circuit 440 may include resistors R13 and R14 coupled between the gates of the NMOS transistors MN14, MN15 and MN16. The second pull-down driving circuit 440 may also include transmission gates TG13 and TG14 coupled between the gate of the NMOS transistor MN16 and each of the gates of NMOS transistors MN15 and MN14. The transmission gates TG13 and TG14 may be set (e.g., turned on or off) in response to the slew-rate control signals C1 and C2. Inverters INV13 and INV14 may receive and invert the slew-rate control signals C1 and C2, respectively. The inverted slew-rate control signals may be received at the gate of a PMOS transistor at each of the transmission gates TG13 and TG14.

The current source IS3 may pull down (e.g., reduce) the current flowing through the NMOS transistors MN11, MN12 and MN13 when the input signal VIN is at the first logic level. Similarly, the current source IS3 may also pull down the current flowing through the NMOS transistors MN14, MN15 and MN16 when the inverted input signal VINB is at the first logic level.

Operation of the transmission line driver 1200 of FIG. 12 according to other example embodiments of the present invention will now be described.

The transmission line driver 1200 of FIG. 12 (e.g., a differential-type transmission line driver) may be employed because the differential-type transmission line driver may include a superior noise characteristic (e.g., increased noise immunity to the power supply). An input signal VIN, an inverted input signal VINB, an output signal VOUT and an inverted output signal VOUTB may be included within the transmission line driver 1200.

In another example embodiment of the operation of the transmission line driver 1200 of FIG. 12, when the slew-rate control signals C1 and C2 are at the first logic level, the input signal VIN may also be at the first logic level and the inverted input signal VINB may be at the second logic level. The transmission gates TG11 and TG12 may be turned on. The voltage potentials at nodes N11, N12 and N13 may be equal to each other. Thus, the input signal VIN may be received at the gates of NMOS transistors MN11, MN12 and MN13. The output signal VOUT may be set to the second logic level because the input signal VIN may be set to the first logic level. Thus, the resistors R11 and R12 may not affect the operation of the circuit. Further, both the transmission gates TG13 and TG14 may be turned on and the voltage potentials of nodes N14, N15 and N16 may be equal to each other. Thus, the inverted input signal VINB may be received at the gates of NMOS transistors MN14, MN15 and MN16, and the inverted output signal VOUTB may be set to the first logic level because the inverted input signal VINB may be at the second logic level. Thus, the resistors R13 and R14 may not affect the operation of the circuit.

In another example embodiment of the operation of the transmission line driver 1200 of FIG. 12, when the slew-rate control signal C1 is at the first logic level and the slew-rate control signal C2 is at the second logic level, the input signal VIN may be set to the first logic level and the inverted input signal VINB may be set to the second logic level. The transmission gate TG11 may be turned on and the transmission gate TG12 may be turned off. The input signal VIN may be received at the gate of the NMOS transistor MN12. A first elongated signal (e.g., a signal including an elongated transition time based on the resistor R12 and the capacitance of the NMOS transistor MN13) may be received at the gate of the NMOS transistor MN13. The output signal VOUT may be set to the second logic level because the input signal VIN may be set to the first logic level. The transmission gate TG14 may turned on and the transmission gate TG13 may be turned off. Thus, the inverted input signal VINB may be received at the gate of NMOS transistor MN16. A second elongated signal (e.g., a signal including an elongated transition time based on the resistor R14 and the capacitance of the NMOS transistor MN15) may be received at the gate of the NMOS transistor MN15. A third elongated signal (e.g., a signal including an elongated transition time based on the resistor R13 and the capacitance of the NMOS transistor MN14) may be received at the gate of the NMOS transistor MN14. The inverted output signal VOUTB may be set to the first logic level because the inverted input signal VINB may bet set to the second logic level.

In another example embodiment of the operation of the transmission line driver 1200 of FIG. 12, when the slew-rate control signals C1 and C2 are at the second logic level, the input signal VIN may set to the first logic level and the inverted input signal VINB may be set to the second logic level. The transmission gates TG11 and TG12 may be turned off. A first elongated signal (e.g., a signal including an elongated transition time based on the resistor R11 and the capacitance of the NMOS transistor MN12) may be received at the gate of the NMOS transistor MN12. A second elongated signal (e.g., a signal including an elongated transition time based on the resistors R11 and R12 and the capacitance of the NMOS transistor MN13) may be received at the gate of the NMOS transistor MN13. The output signal VOUT may be set to the second logic level because the input signal VIN is set to the first logic level. The transmission gates TG14 and TG13 may be turned off when both the slew-rate control signals C1 and C2 are set to the second logic level. Thus, a third elongated signal (e.g., a signal including an elongated transition time based on the resistor R14 and the capacitance of the NMOS transistor MN15) may be received at the gate of the NMOS transistor MN15. A fourth elongated signal (e.g., a signal including an elongated transition time based on the resistors R13 and R14 and the capacitance of the NMOS transistor MN14) may be received at the gate of the NMOS transistor MN14. The inverted output signal VOUTB may be set to the first logic level because the inverted input signal VINB may be set to the second logic level.

In the above-described example embodiments of the operation of the transmission line driver 1200 of FIG. 12, the waveforms of the input signals and output signals of the transmission line driver 1200 of FIG. 12 may be considered to be similar to those shown in FIG. 7–10 and above-described with respect to the transmission line driver 400 of FIG. 4. Thus, the waveforms related to the example embodiments of the transmission line driver 1200 of FIG. 12 will not be described further.

In the above-described example embodiments of FIG. 12, the transmission line driver 1200 may control the slew rate of a circuit with the slew-rate control signals C1 and C2 (e.g., by changing the resistances of the resistors R11, R22, R13 and R14 coupled between the gates of the transistors MN11, MN12, MN13, MN14, MN15 and/or MN16).

Figure 13:
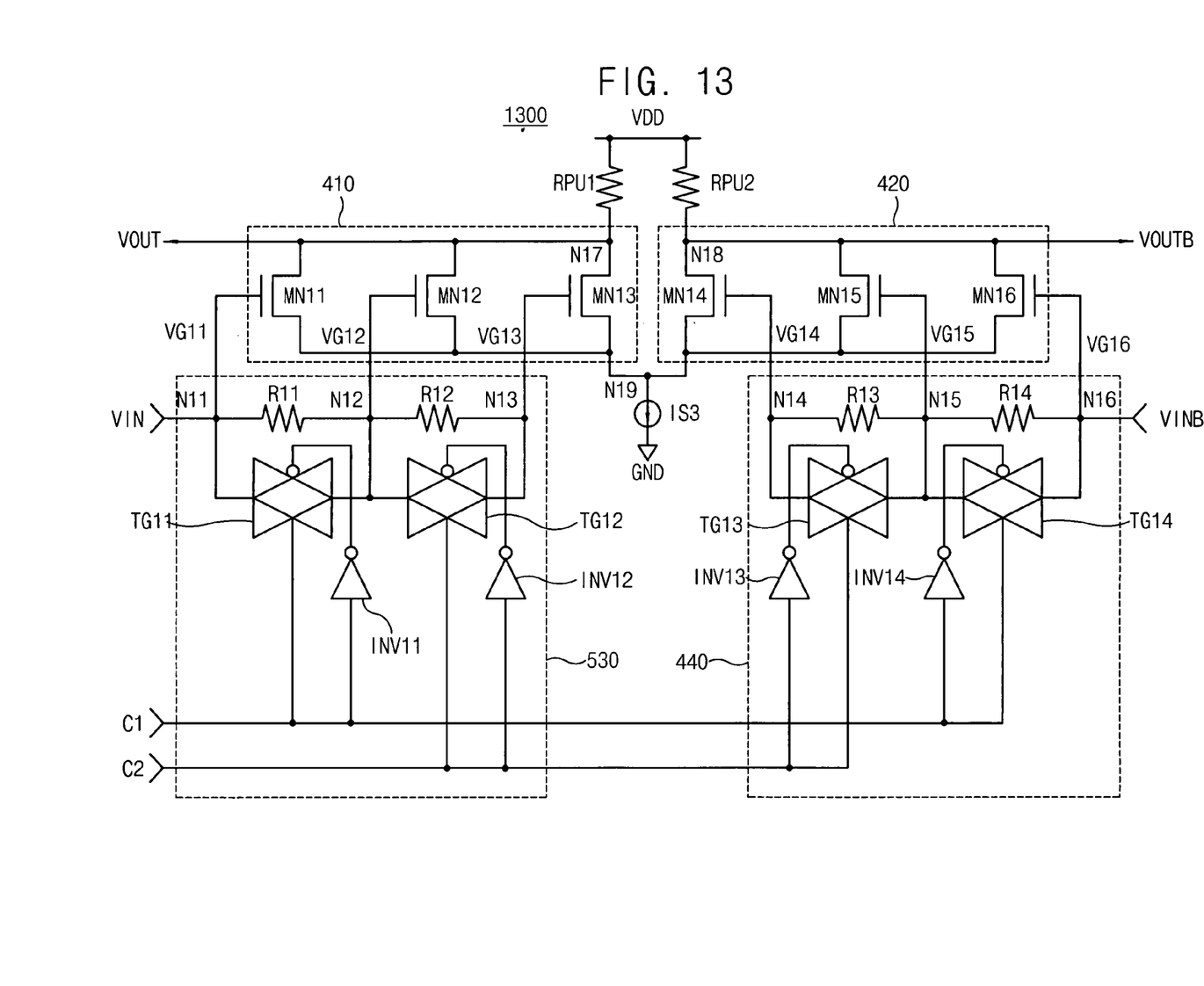
FIG. 13 is a circuit diagram illustrating another transmission line driver according to another example embodiment of the present invention.

FIG. 13 is a circuit diagram illustrating another transmission line driver 1300 according to another example embodiment of the present invention. The transmission line driver 1300 of FIG. 13 may function similar to the transmission line driver 1200 of FIG. 12 except for the connection structures of the transmission gates TG11, TG12, TG13 and TG14 in first and second pull-down driving circuits 530 and 440.

An operation of the transmission line driver 1300 of FIG. 13 according to other example embodiments of the present invention will now be given.

In another example embodiment of the operation of the transmission line driver 1300 of FIG. 13, when the slew-rate control signals C1 and C2 are set to the second logic level, the input signal VIN may be set to the first logic level and the inverted input signal VINB may be set to the second logic level. The transmission gates TG11 and TG12 may be turned off. A first elongated signal (e.g., a signal including an elongated transition time based on the resistor R11 and the capacitance of the NMOS transistor MN12) may be received at the gate of the NMOS transistor MN12. A second elongated signal (e.g., a signal including an elongated transition time based on the resistors R11 and R12 and the capacitance of the NMOS transistor MN13) may be received at the gate of the NMOS transistor MN13. The transmission gates TG14 and TG13 may be turned off when both the slew-rate control signals C1 and C2 are at the second logic level. Thus, a third elongated signal (e.g., a signal including an elongated transition time based on the resistor R14 and the capacitance of the NMOS transistor MN15) may be received at the gate of the NMOS transistor MN15. A fourth elongated signal (e.g., a signal including an elongated transition time based on the resistors R13 and R14 and the capacitance of the NMOS transistor MN14) may be received at the gate of the NMOS transistor MN14.

Figure 14:
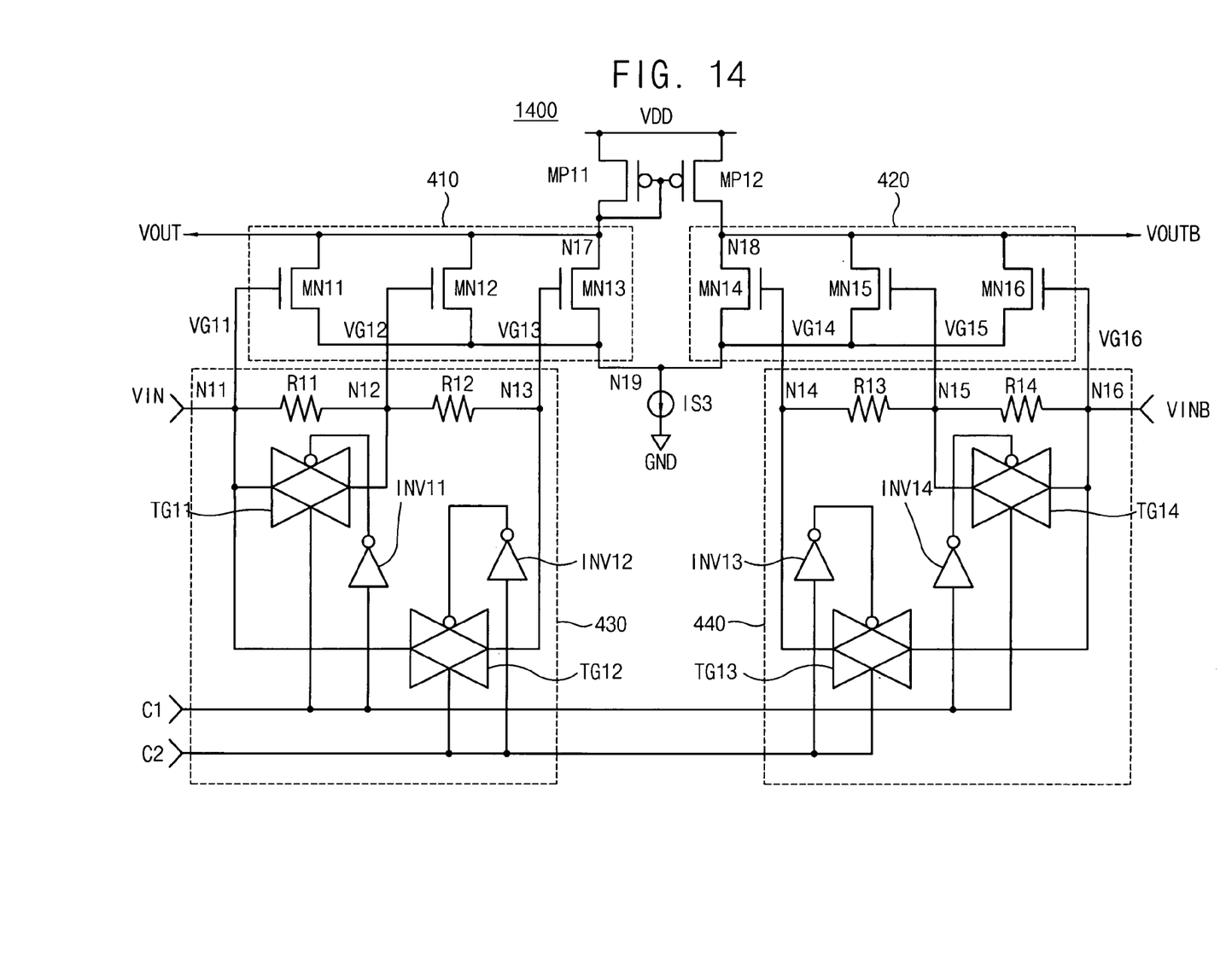
FIG. 14 is a circuit diagram illustrating a transmission line driver according to yet another example embodiment of the present invention.

FIG. 14 is a circuit diagram illustrating a transmission line driver 1400 according to yet another example embodiment of the present invention. The transmission line driver 1400 of FIG. 14 may function similar to the transmission line driver 1200 of FIG. 12 except that the pull-up transistors RPU1 and RPU2 (in FIG. 12) may be replaced by PMOS transistors MP11 and MP12 (in FIG. 14).

In another example embodiment of the present invention, the transmission line drivers 1200/1300/1400 may be differential-type transmission line drivers. Differential-type transmission line drivers may include a desired noise characteristic (e.g., increased noise immunity to the power supply). Further, the transmission line drivers 1200/1300/1400 may include a reduced signal loss in higher-speed operations. Thus, the transmission line drivers 1200/1300/1400 may be suitable for higher-speed operation systems.

The example embodiments of the present invention being thus described, it will be obvious that the same may be varied in many ways. For example, while the above-described example embodiments include references to the first and second logic levels, in one example the first logic level may refer to a higher logic level and the second logic level may refer to a lower logic level. Alternatively, in another example, the first logic level may refer to a lower logic level and the second logic level may refer to a higher logic level. Further, while above described example embodiments illustrate three MOS transistors (NMOS transistors MN3, MN4 and MN5), two resistors (e.g., resistors R1 and R2), two transmission gates (e.g., transmission gates TG1 and TG2) and two slew rate control signals (e.g., slew rate control signals C1 and C2), it is understood that transmission line drivers according to other example embodiments of the present invention may scale to include any number of MOS transistors, resistors, transmission gates and/or slew rate control signals.

Such variations are not to be regarded as departure from the spirit and scope of the example embodiments of the present invention, and all such modifications as would be obvious to one skilled in the art are intended to be included within the scope of the following claims.

What is claimed is:

1. A transmission line driver, comprising:
    a first resistance element coupled between a first supply voltage and a first output node;
    a first pull-down device coupled between the first output node and a first plurality of driving signals; and
    a first pull-down driving circuit configured to receive a first input signal to generate the first plurality of driving signals, a slope of a voltage level of at least one of the first plurality of driving signals during a logic transition being selected based on at least one slew-rate control signal.

2. The transmission line driver of claim 1, further comprising a current source coupled between the first pull-down device and a ground voltage.

3. The transmission line driver of claim 1, wherein the first pull-down driving circuit adjusts a resistance in order to change a slew rate of the transmission line driver.

4. The transmission line driver of claim 1, wherein at least one of the first pull-down device includes a plurality of MOS transistors.

5. The transmission line driver of claim 1, wherein the first pull-down driving circuit includes:
    at least one resistor coupled between a first MOS transistor and a second MOS transistor; and
    at least one switch coupled between the first MOS transistor and the second MOS transistor, the at least one switch configured to be one of turned on and turned off in response to the at least one slew-rate control signal.

6. The transmission line driver of claim 5, wherein the first and second MOS transistors are included within the first pull-down device.

7. The transmission line driver of claim 5, wherein a slew rate increases with a number of the at least one switch configured to be turned off.

8. The transmission line driver of claim 5, wherein the at least one switch includes a transmission gate having a second PMOS transistor and a second NMOS transistor.

9. The transmission line driver of claim 5, wherein the at least one resistor includes first and second resistors having the same resistance.

10. The transmission line driver of claim 5, wherein a slew rate of an output signal of the first output node is controlled by adjusting a resistance of the at least one resistor.

11. The transmission line driver of claim 4, wherein the plurality of MOS transistors include at least one source area and at least one drain area.

12. The transmission line driver of claim 4, wherein the plurality of MOS transistors include a gate electrode of a multi-finger type.

13. The transmission line driver of claim 1, wherein the first resistance element is a pull-up resistor.

14. The transmission line driver of claim 1, wherein the first resistance element is a MOS transistor.

15. The transmission line driver of claim 14, wherein the MOS transistor is an NMOS transistor.

16. The transmission line driver of claim 1, wherein the first pull-down driving circuit includes a first switch configured to receive first input signal and a first slew rate control signal and a second switch configured to receive the first input signal and a second slew rate control signal.

17. The transmission line driver of claim 1, wherein the first pull-down driving circuit includes a first switch configured to receive the first input signal and a first slew rate control signal and a second switch configured to receive an output of the first switch and a second slew rate control signal.

18. The transmission line driver of claim 1, further comprising:
a second resistance element coupled between the first supply voltage and a second output node;
a second pull-down device coupled between the second output node and a second plurality of driving signals; and
a second pull-down driving circuit configured to receive a third power supply voltage to generate the second plurality of driving signals, a slope of at least one of the second plurality of driving signals being based on the at least one slew-rate control signal.

19. The transmission line driver of claim 18, wherein the second resistance element is a pull-up resistor.

20. The transmission line driver of claim 18, wherein the second resistance element is a MOS transistor.

21. The transmission line driver of claim 20, wherein the MOS transistor is an NMOS transistor.

22. The transmission line driver of claim 18, wherein at least one of the first and second pull-down driving circuits adjusts a resistance to control a slew rate.

23. The transmission line driver of claim 18, wherein each of the first and second pull-down devices includes a plurality of MOS transistors.

24. The transmission line driver of claim 18, wherein the second pull-down driving circuit includes:
at least one resistor coupled between a first MOS transistor and a second MOS transistor; and
at least one switch coupled between the first MOS transistor and the second MOS transistor, the at least one coupled switch configured to be one of turned on and turned off in response to the at least one slew-rate control signal.

25. The transmission line driver of claim 24, wherein the first and second MOS transistors are included within the second pull-down device.

26. The transmission line driver of claim 24, wherein the at least one switch includes a transmission gate having a PMOS transistor and an NMOS transistor.

27. The transmission line driver of claim 24, wherein the at least one coupled resistor includes first and second resistors having the same resistance.

28. The transmission line driver of claim 24, wherein a slew rate of an output signal is controlled by adjusting a resistance of the at least one resistor.

29. The transmission line driver of claim 23, wherein the plurality of MOS transistors includes at least one source area and at least one drain area.

30. The transmission line driver of claim 23, wherein the plurality of MOS transistors includes a gate electrode of a multi-finger type.

31. The transmission line driver of claim 18, wherein the second pull-down driving circuit includes a first switch configured to receive the second input signal and a first slew rate control signal and a second switch configured to receive the third supply voltage and a second slew rate control signal.

32. The transmission line driver of claim 18, wherein the second pull-down driving circuit includes a first switch configured to receive the second input signal and a first slew rate control signal and a second switch configured to receive an output of the first switch and a second slew rate control signal.

33. A method of controlling a slew rate, comprising:
maintaining an output node at a first logic level;
generating a plurality of driving signals, each of the plurality of driving signals from an input signal including a different slope of a voltage level during a logic transition selected based on at least one slew rate control signal; and
transitioning the output node from the first logic level to a second logic level in response to the plurality of driving signals.

34. The method of claim 33, wherein at least one resistance is adjusted in response to the at least one slew-rate control signal.

35. The method of claim 34, wherein a slew rate decreases as the at least one resistance increases.

36. A method of controlling a slew rate, comprising:
adjusting a resistance in order to generate a plurality of driving voltages including at least two different slopes, at least one of the at least two different slopes based on the adjusted resistance.

37. The method of claim 36, wherein the resistance is adjusted in response to the at least one slew-rate control signal.

38. The method of claim 36, wherein the at least one slope decreases if the adjustment increases the resistance.

39. The method of claim 36, wherein the generated driving voltages affect a slew rate.

40. A transmission line driver for performing the method of claim 33.

41. A transmission line driver for performing the method of claim 36.

* * * * *